(12) United States Patent
Lin et al.

(10) Patent No.: US 8,747,696 B2
(45) Date of Patent: Jun. 10, 2014

(54) PHOSPHORS AND WHITE LIGHT ILLUMINATION DEVICES UTILIZING THE SAME

(75) Inventors: Jen-Chun Lin, Hsinchu (TW); Su-Ren Wang, Hsinchu (TW); Pei-Chun Tsai, Hsinchu (TW); Kuo-Ju Chen, Hsinchu (TW); Chun-Che Lin, Hsinchu (TW); Ru-Shi Liu, Hsinchu (TW)

(73) Assignee: China Glaze Co., Ltd., Hsinchu County (TW)

( * ) Notice: Subject to any disclaimer, the term of this patent is extended or adjusted under 35 U.S.C. 154(b) by 414 days.

(21) Appl. No.: 12/954,675

(22) Filed: Nov. 26, 2010

(65) Prior Publication Data

US 2011/0254435 A1  Oct. 20, 2011

(30) Foreign Application Priority Data

Apr. 20, 2010 (TW) ............................ 99112273 A (51) Int. Cl.
*C09K 11/80* (2006.01)
*H01L 33/00* (2010.01)

(52) U.S. Cl.
USPC ................. 252/301.4 R; 313/503; 257/98

(58) Field of Classification Search
USPC ................. 252/301.4 R; 257/98; 313/503
See application file for complete search history.

(56) References Cited

U.S. PATENT DOCUMENTS

| 3,657,140 | A  | * | 4/1972  | Gibbons et al. ........ 252/301.4 R |
| 5,998,925 | A  | * | 12/1999 | Shimizu et al. ................ 313/503 |
| 7,023,019 | B2 | * | 4/2006  | Maeda et al. ..................... 257/89 |
| 7,094,362 | B2 | * | 8/2006  | Setlur et al. ............. 252/301.4 F |
| 2009/0008663 | A1 | * | 1/2009 | Shimizu et al. .................. 257/98 |

FOREIGN PATENT DOCUMENTS

CN  101376522  *  3/2009

OTHER PUBLICATIONS

Derwent abstract for CN 1011376522, Mar. 4, 2009.*
Translation for CN 101376522, Mar. 4, 2009.*
Allison et al, "Temperature-dependent fluorescence decay lifetimes of the phosphor $Y_3(Al_{0.5}Ga_{0.5})_5O_{12}:Ce$ 1%", Joun. Appl. Phys. 105, Feb. 2009, 036105, 1-3.*

* cited by examiner

*Primary Examiner* — Carol M Koslow
(74) *Attorney, Agent, or Firm* — Pai Patent & Trademark Law Firm; Chao-Chang David Pai (57) ABSTRACT

Disclosed are compositions and synthetic methods of phosphors that can be efficiently excited by blue light. The wavelength of the blue light is between 400 nm to 480 nm. The phosphors contain garnet fluorescent material activated with cerium, which contain Ba, Y, Tb, Lu, Sc, La, Gd, Sm, or combinations thereof, and Al, Ga, In, or combinations thereof. In addition, the phosphors are easily and quickly prepared in a large amount. The phosphors have high thermal stability and high emission intensity, therefore, being high of value in industry for utilization.

4 Claims, 7 Drawing Sheets

PHOSPHORS AND WHITE LIGHT ILLUMINATION DEVICES UTILIZING THE SAME

CROSS REFERENCE TO RELATED APPLICATIONS

This Application claims priority of Taiwan Patent Application No. 099112273, filed on Apr. 20, 2010, the entirety of which is incorporated by reference herein.

BACKGROUND OF THE INVENTION

1. Field of the Invention

The present invention relates to phosphors, and in particular relates to white light illumination devices utilizing the same.

2. Description of the Related Art

In 1962, Nick Holonyak Jr. of General Electric Company developed the first commercial visible light emitting diode. In the 1970s, GaP-based and GaAsP-based LEDs were developed for emitting red light, yellow light, orange light, green light, and the likes for indication lamps or digital displays. In 1991, the InGaAlP-based LEDs were developed for LEDs that had high brightness. The LEDs with high brightness were applied in traffic lights, brake lights, taillights, and the likes. Still in 1991, Shuji Nakamura of Nichia Corporation invented GaN-based and InGaN-based LEDs for emitting blue-violet light. It was the first commercial blue-violet LED product available at the time, which was applied in the backlighting of keypads and full color billboards. In 1996, Nichia Corporation collocated LED chips with a yellow phosphor ($(Y,Gd)_3(Al,Ga)_5O_{12}:Ce^{3+}$, YAG) to for commercially available white light LEDs. However, because a part of the blue light from the LED chip needed to be mixed with the yellow light from the yellow phosphor to produce white light, the white LEDs had a very high color temperature; especially when driven by high current. Also, YAG phosphors had lower emission efficiency at higher temperatures.

In 1999, U.S. Pat. No. 5,998,925 (Shimizu et al.) disclosed a blue light chip collocated with phosphors to produce white light, wherein the phosphors contained garnet fluorescent material activated with cerium, which contained Y, Lu, Sc, La, Gd, Sm, or combinations thereof, and Al, Ga, In, or combinations thereof. The phosphors in Shimizu et al. had low thermal stability, and it was easy for the phosphors to thermally decay under high temperatures.

Accordingly, a novel phosphor formula is called for, for meeting the requirements of high thermal stability and high emission intensity.

BRIEF SUMMARY OF THE INVENTION

One embodiment of the invention provides a phosphor, having a formula: $(Re_{1-y}Ba_y)_{3-x}(Rg)_5O_{12}:Ce_x$, wherein Re is Y, Tb, Lu, Sc, La, Gd, Sm, or combinations thereof, Rg is Al, Ga, In, or combinations thereof, $0<x<3$, and $0<y<1$.

Another embodiment of the invention provides a white light illumination device, comprising the described phosphor and an excitation light source, wherein the excitation light source emits 420-480 nm blue light to excite the phosphor. When a UV-excitable blue phosphor is collocated with the desired phosphor, an excitation light source emitting 380-420 nm UV may be applied to emit the blue light for exciting the desired phosphor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

One embodiment of the invention provides a phosphor, having a formula: $(Re_{1-y}Ba_y)_{3-x}(Rg)_5O_{12}:Ce_x$, wherein Re is Y, Tb, Lu, Sc, La, Gd, Sm, or combinations thereof, Rg is Al, Ga, In, or combinations thereof, $0<x<3$, and $0<y<1$. In one embodiment, the phosphor is composed of $(Y_{2.2}Ba_{0.6})Al_5O_{12}:Ce_{0.2}$.

The phosphor can be excited by 420-480 nm blue light to emit a yellow light. The yellow light has a major emission peak of about 564 nm. The excitation light source applied to emit blue light includes a light emitting diode or a laser diode.

The method for preparing the described phosphor is a solid-reaction method. First, an appropriate stoichiometry of reagents was weighted according to the element molar ratio of a resulting phosphor. The reagents containing Ba can be sulfates such as $BaSO_4$, carbonates such as $BaCO_3$, or halides such as $BaF_2$. The reagents containing Y, Tb, Lu, Sc, La, Gd, or Sm can be oxides such as $Y_2O_3$, or nitrates such as $Tb(NO_3)_3$. The reagents containing Al, Ga, or In can be oxides such as $\gamma\text{-}Al_2O_3$, $Ga_2O_3$, or $In_2O_3$. The reagents containing Ce can be oxides such as $CeO_2$. The described reagents of appropriate equivalent were evenly mixed and grinded in a crucible. The mixture was then heated in a high temperature furnace. After sintering at 1300° C. to 1500° C. for 8-16 hours under a reducing atmosphere (5% $H_2$ and 95% $N_2$), a phosphor was prepared.

In one embodiment, the phosphor is excited by blue light to emit yellow light. As such, the yellow phosphor may be collocated with a UV excitable blue phosphor. Arranged with an ultraviolet excitation light source such as a light-emitting diode or a laser diode, a white light emitting diode or a white laser diode may be completed. The blue phosphor includes $BaMgAl_{10}O_{17}:Eu^{2+}$, $(Ba,Sr,Ca)_5(PO_4)_3(F,Cl,Br,OH):Eu^{2+}$, $2SrO*0.84P_2O_5*0.16B_2O_3:Eu^{2+}$, $Sr_2Si_3O_8*2SrCl_2:Eu^{2+}$, $(Mg,Ca,Sr,Ba,Zn)_3B_2O_6:Eu^{2+}$, or other suitable blue phosphors. In indirect excitation mode, the blue phosphor is firstly excited by a UV light to emit a blue light, the yellow phosphor is then excited by the blue light to emit a yellow light, and the blue and yellow lights are mixed to form a white light. In direct excitation mode, the LED chip or laser LED emitting blue light is directly collocated with the yellow phosphor.

Figure 1:
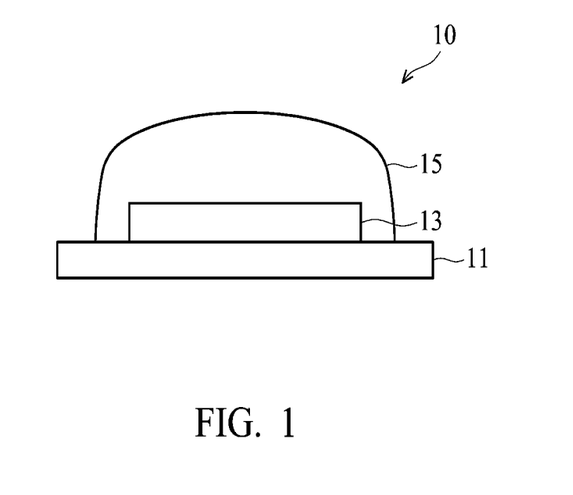
FIG. 1 shows the white light emitting device of the invention.

The white light emitting device is shown as FIG. 1. If the direct excitation mode is selected, the yellow phosphor can be evenly dispersed in a transparent optical gel to form a light emitting layer 15. An LED (or a laser diode) chip 13 located on the substrate 11 may emit a blue light. The light emitting layer 15 is used to seal the chip 13, thereby completing a white light illumination device 10. If the indirect excitation mode is selected, the yellow and blue phosphors can be evenly mixed in a preferable ratio and dispersed in an optical gel to form a light emitting layer 15. An LED (or a laser diode) chip 13 located on the substrate 11 may emit a UV light. The light emitting layer 15 is used to seal the chip 13, thereby completing a white light illumination device 10. Note that if the UV light is selected as the excitation light source, a UV filter or other UV insulators should be arranged externally from the white light illumination device to protect the eyes and skin of users.

EXAMPLES

Comparative Example 1

According to chemical stoichiometry, an appropriate amount of $Y_2O_3$, $CeO_2$, and $Al_2O_3$ were evenly mixed and grinded in a crucible. The mixture was heated in a high temperature furnace. After sintering at 1300° C. to 1500° C. for 8-16 hours under a reducing atmosphere (5% $H_2$ and 95% $N_2$), the $Ce^{4+}$ ion of the luminescence center was reduced to $Ce^{3+}$ ion. As a result, a phosphor $Y_{2.8}Al_5O_{12}:Ce_{0.2}$ was prepared. The product was yellow in appearance.

Example 1

According to chemical stoichiometry, an appropriate amount of $Y_2O_3$, $CeO_2$, $Al_2O_3$, and $BaF_2$ were evenly mixed and grinded in a crucible. The mixture was heated in a high temperature furnace. After sintering at 1300° C. to 1500° C. for 8-16 hours under a reducing atmosphere (5% $H_2$ and 95% $N_2$), the $Ce^{4+}$ ion of the luminescence center was reduced to $Ce^{3+}$ ion. As a result, the phosphor $(Y_{2.2}Ba_{0.6})Al_5O_{12}:Ce_{0.2}$ was prepared. The product was yellow in appearance.

Figure 2A:
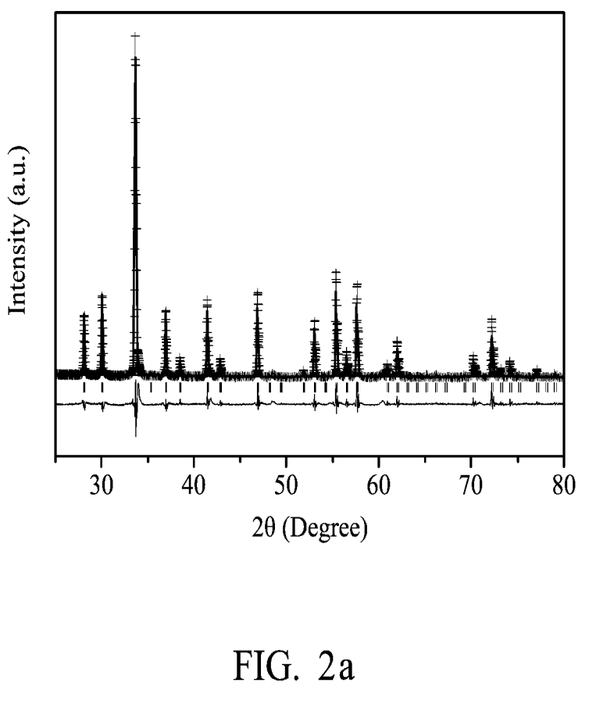
FIG. 2a shows an X-ray powder diffraction spectrum of the phosphor $Y_{2.8}Al_5O_{12}:Ce_{0.2}$ in one embodiment of the invention.
Figure 2B:
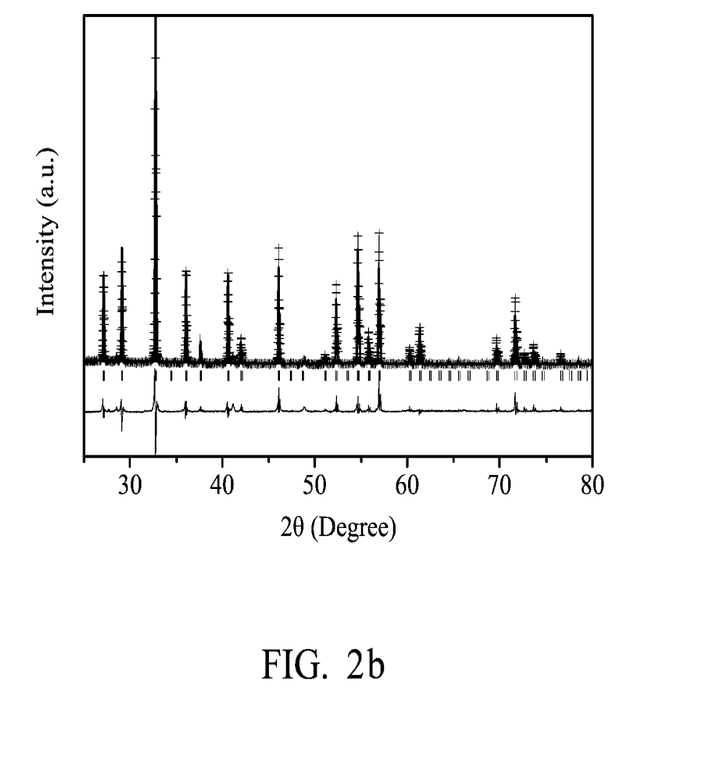
FIG. 2b shows an X-ray powder diffraction spectrum of the phosphor $(Y_{2.2}Ba_{0.6})Al_5O_{12}:Ce_{0.2}$ in one embodiment of the invention.

As shown in FIGS. 2a and 2b, the crystal phase purity of the solid phase synthesized phosphors $Y_{2.8}Al_5O_{12}:Ce_{0.2}$ and $(Y_{2.2}Ba_{0.6})Al_5O_{12}:Ce_{0.2}$ was identified by X-ray powder diffraction. The lattice parameters and the reliability indexes of the product in Comparative Example 1 were obtained by structure refinement, as tabulated in Table 1. The reliability indexes of $Y_{2.8}Al_5O_{12}:Ce_{0.2}$ crystal included $\chi^2$=being 3.41, $R_{wp}$=8.83%, and $R_p$=5.68%. The lattice parameters of $Y_{2.8}Al_5O_{12}:Ce_{0.2}$ crystal were a=b=c=12.0225(1) Å, and the lattice volume thereof was 1737.73(8) Å$^3$. The lattice parameters and the reliability indexes of the product in Example 1 were obtained by structure refinement, as tabulated in Table 2. The reliability indexes of $(Y_{2.2}Ba_{0.6})Al_5O_{12}:Ce_{0.2}$ crystal included $\chi^2$=being 3.66, $R_{wp}$=9.55%, and $R_p$=5.95%. The lattice parameters of $(Y_{2.2}Ba_{0.6})Al_5O_{12}:Ce_{0.2}$ crystal were a=b=c=12.02854(6) Å, and the lattice volume thereof was 1740.35(9) Å$^3$. As proven by the reliability indexes, both of the phosphors in Example 1 and Comparative Example 1 had pure crystal phase. According to Vegard's Law, the solid state material may be expanded or compressed by doping ions of different diameters. As such, the lattice volume of the doped material is directly influenced by the dopant size. Because part of the $Y^{2+}$ ions were replaced by larger $Ba^{2+}$ ions in Example 1, both of the lattice parameters and the lattice volume thereof were expanded. Therefore, Ba ions were doped in the synthesized $(Y,Ba)_{3-x}Al_5O_{12}:Ce_x$ sample.

TABLE 1

| Atoms | x/a | y/b | z/c | Frac. | Uiso |
|---|---|---|---|---|---|
| Al(1) | 0.000000 | 0.000000 | 0.000000 | 1.00 | 0.01647 |
| Al(2) | 0.375000 | 0.000000 | 0.250000 | 1.00 | 0.01646 |
| Y(1) | 0.125000 | 0.000000 | 0.250000 | 2.80 | 0.01500 |
| O(1) | 0.469334 | 0.051709 | 0.352001 | 1.00 | 0.00716 |
| Ce | 0.125000 | 0.000000 | 0.250000 | 0.20 | 0.015000 |

Crystal structure: cubic; Space group: I a-3 d; a = b = c = 12.0225(1) Å, Cell volume = 173733(8) Å$^3$; $\chi^2$ = 3.41, $R_p$ = 5.68%, and $R_{wp}$ = 8.83%.

TABLE 2

| Atoms | x/a | y/b | z/c | Frac. | Uiso |
|---|---|---|---|---|---|
| Al(1) | 0.000000 | 0.000000 | 0.000000 | 1.00 | 0.00528 |
| Al(2) | 0.375000 | 0.000000 | 0.250000 | 1.00 | 0.01616 |
| Y(1) | 0.125000 | 0.000000 | 0.250000 | 2.26 | 0.00872 |
| O(1) | 0.466962 | 0.000000 | 0.347867 | 1.00 | 0.00164 |
| Ba | 0.125000 | 0.052946 | 0.250000 | 0.57 | 0.025000 |
| Ce | 0.125000 | 0.000000 | 0.250000 | 0.20 | 0.025000 |

Crystal structure: cubic; Space group: I a-3 d; a = b = c = 12.02854(6) Å, Cell volume = 1740.35(9) Å$^3$; $\chi^2$ = 3.66, $R_p$ = 5.95%, $R_{wp}$ = 9.55%.

Figure 3A:
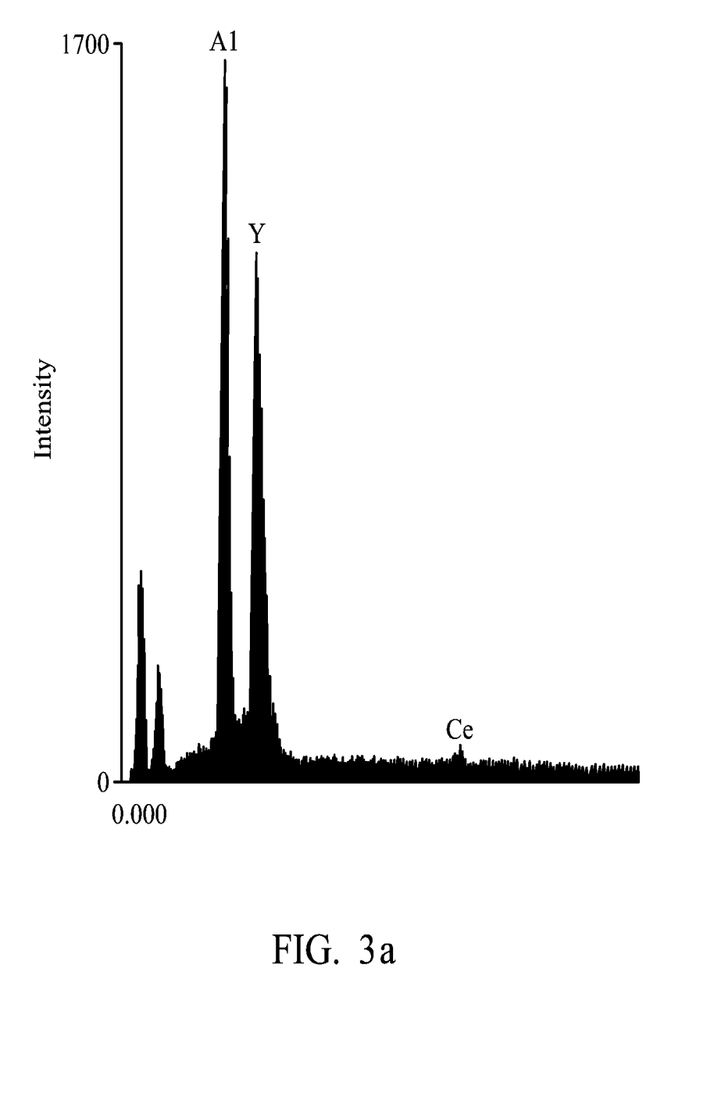
FIG. 3a shows an EDS spectrum of the phosphor $Y_{2.8}Al_5O_{12}:Ce_{0.2}$ in one embodiment of the invention.
Figure 3B:
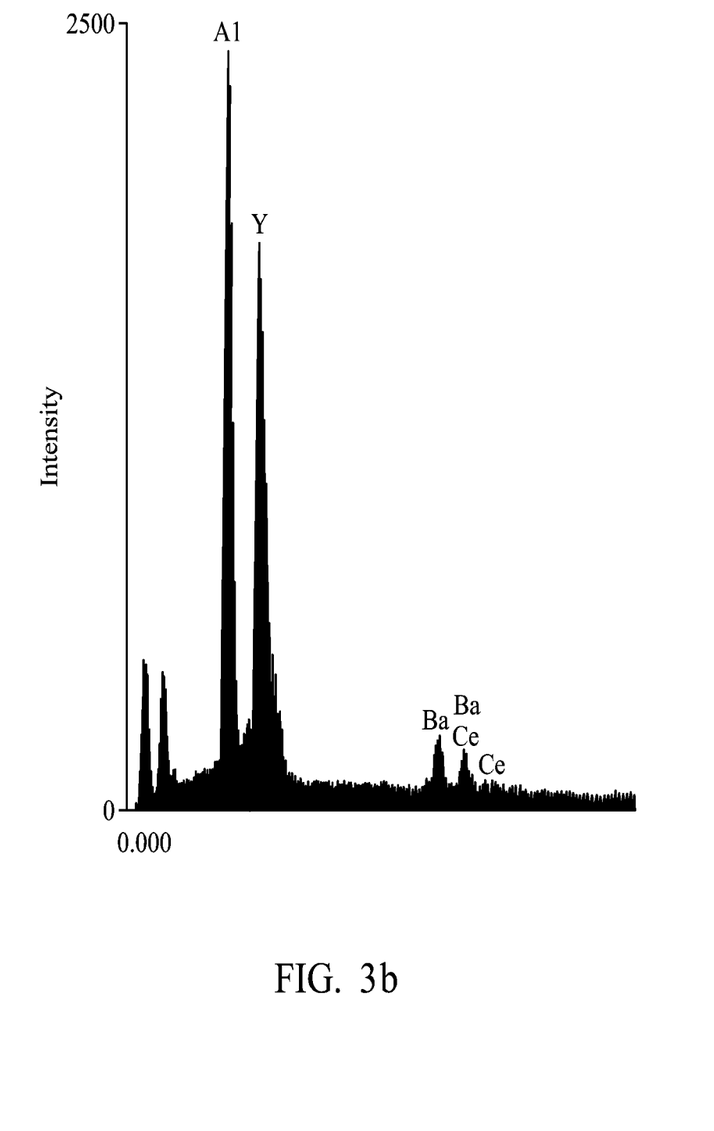
FIG. 3b shows an EDS spectrum of the phosphor $(Y_{2.2}Ba_{0.6})Al_5O_{12}:Ce_{0.2}$ in one embodiment of the invention.
Figure 4:
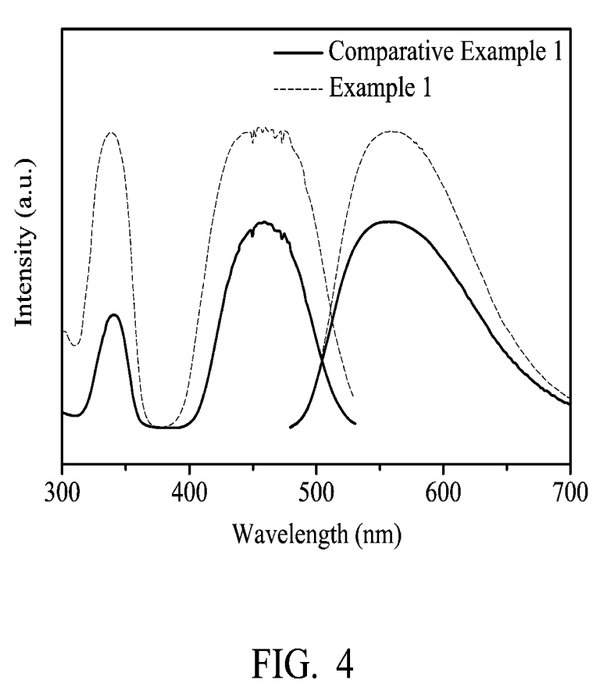
FIG. 4 shows the comparison of emission spectra between the phosphors, $Y_{2.8}Al_5O_{12}:Ce_{0.2}$ and the $(Y_{2.2}Ba_{0.6})Al_5O_{12}:Ce_{0.2}$, excited by a 460 nm light.
Figure 5:
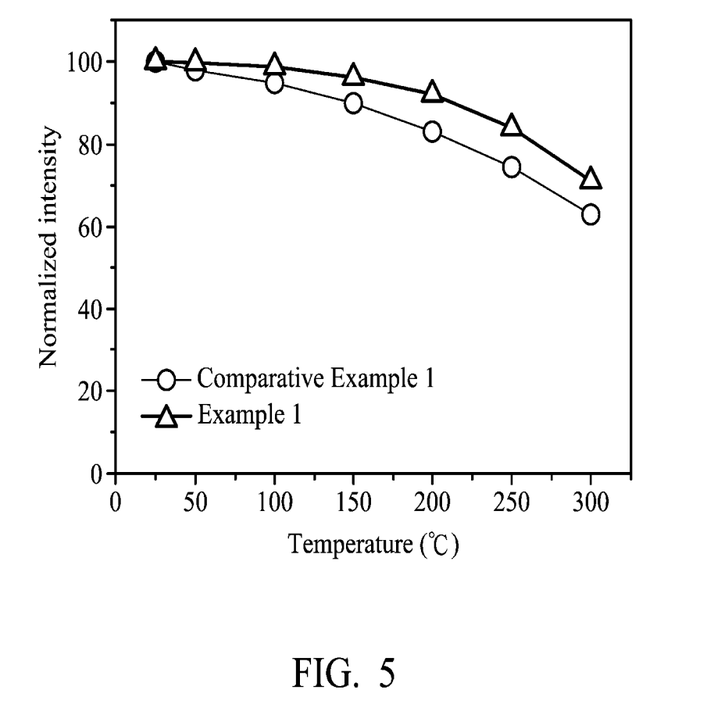
FIG. 5 shows the comparison of thermal stabilities between the phosphors $Y_{2.8}Al_5O_{12}:Ce_{0.2}$ and the $(Y_{2.2}Ba_{0.6})Al_5O_{12}:Ce_{0.2}$.

As shown in the EDS (Energy Dispersive Spectrometer) spectra comparison of FIGS. 3a and 3b, the phosphor in Example 1 was doped with Ba ion, wherein the atomic ratio of Y and Ba (2.2:0.6) was obtained by theoretical calculation. FIG. 4 shows emission spectra of the phosphors, $(Y_{2.8}Ce_{0.2})Al_5O_{12}$ and $(Y_{2.2}Ba_{0.6})Al_5O_{12}:Ce_{0.2}$, excited by a 460 nm blue light. As shown in FIG. 4, the phosphor doped with Ba in Example 1 had higher emission intensity. As shown in FIG. 5, the comparison of the thermal stabilities between the phosphors, $(Y_{2.8}Ce_{0.2})Al_5O_{12}$ in Comparative Example 1 and $(Y_{2.2}Ba_{0.6})Al_5O_{12}:Ce_{0.2}$ in Example 1, were measured by a spectroscopic system. When the temperature was enhanced, the emission intensity of the spectra was decreased. This phenomenon is the so-called thermal quench. If electrons of a phosphor are excited to an excitation state at a high temperature, the electrons gaining thermal energy will vibrate to a higher vibration level. If the vibration level of the excitation state is equal to the ground state potential curve, the vibration level of the excited state and the ground state potential curve will have a crossing point in an energy diagram. As such, the electrons possibly transit from the excitation state to the ground state through the crossing point, and then relax to the lowest level of the ground state by vibration. If the electrons go through the above path, the excitation energy is consumed at a crystal lattice other than contributing to luminance. When the difference (ΔR) between the equilibrium distance of the ground state and the equilibrium distance of the excitation state is larger, it is easier for the non-radiative relaxation to occur. In Example 1, the phosphor was doped by Ba ion having a higher molecular weight, such that the difference between the equilibrium distances of the ground state and the excitation state was shortened. As a result, the phosphor in Example 1 had higher activation energy, lower thermal quenching possibility, and better thermal stability. As shown in FIG. 5, the phosphor $(Y_{2.2}Ba_{0.6})Al_5O_{12}:Ce_{0.2}$ in Example 1 had higher thermal stability than the phosphor $(Y_{2.8}Ce_{0.2})Al_5O_{12}$. Accordingly, part of Y was replaced with a Ba ion dopant to enhance the thermal stability of the phosphor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phosphor, having a formula: $(Y_{2.2}Ba_{0.6})Al_5O_{12}:Ce_{0.2}$ wherein the phosphor is excited by a 400-480 nm blue light to emit a yellow light, and the yellow light has a major emission peak of about 564 nm.

2. A white light illumination device, comprising a phosphor having a formula:

$(Re_{1-y}Ba_y)_{3-x}(Rg)_5O_{12}:Ce_x$, wherein:

Re is Y, Tb, Lu, Sc, La, Gd, Sm, or combinations thereof;
Rg is Al, Ga, In, or combinations thereof;
$0<x<3$; and
$0<y<1$;
a blue phosphor; and
an excitation light source, wherein the excitation light source emits a 380-420nm UV to excite the blue phosphor to emit a blue light, or a 420-480 nm blue light to excite the phosphor.

3. The white light illumination device as claimed in claim 2, wherein the excitation light source comprises a light emitting diode or a laser diode.

4. The white light illumination device as claimed in claim 2, wherein the blue phosphor comprises $BaMgAl_{10}O_{17}:EU^{2+}$, $(Ba,Sr,Ca)_5(PO_4)_3(F,Cl,Br,OH):Eu^{2+}$, $2SrO*0.84P_2O_5*0.16B_2O_3:Eu^{2+}$, $Sr_2Si_3O_8*2SrCl_2:Eu^{2+}$, or $(Mg,Ca,Sr,Ba,Zn)_3B_2O_6:Eu^{2+}$.

* * * * *